US012178028B2

(12) United States Patent
Kang

(10) Patent No.: US 12,178,028 B2
(45) Date of Patent: Dec. 24, 2024

(54) DISPLAY DEVICE

(71) Applicant: LG ELECTRONICS INC., Seoul (KR)

(72) Inventor: Seunggyu Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 246 days.

(21) Appl. No.: 17/918,874

(22) PCT Filed: Apr. 13, 2020

(86) PCT No.: PCT/KR2020/004949
§ 371 (c)(1),
(2) Date: Oct. 13, 2022

(87) PCT Pub. No.: WO2021/210691
PCT Pub. Date: Oct. 21, 2021

(65) Prior Publication Data
US 2023/0247812 A1 Aug. 3, 2023

(51) Int. Cl.
H05K 9/00 (2006.01)
(52) U.S. Cl.
CPC ......... H05K 9/0054 (2013.01); H05K 9/0081 (2013.01)
(58) Field of Classification Search
CPC .... H05K 9/0054; H05K 9/0081; H05K 9/002; H05K 5/0017; H05K 5/0234; H05K 9/0064; G02F 1/133314; G02F 1/133334
See application file for complete search history.

(56) References Cited

U.S. PATENT DOCUMENTS

2005/0079748 A1    4/2005  Kim
2017/0171960 A1*   6/2017  Yang ................... H05K 1/0215
2018/0279514 A1*   9/2018  Maemuko ............ H05K 9/0054

FOREIGN PATENT DOCUMENTS

JP      08-078867       3/1996
JP      10-308590       11/1998
(Continued)

OTHER PUBLICATIONS

European Patent Office Application Serial No. 20931053.1, Search Report dated Dec. 11, 2023, 13 pages.
(Continued)

Primary Examiner — Abhishek M Rathod
Assistant Examiner — Keon Kim
(74) Attorney, Agent, or Firm — LEE, HONG, DEGERMAN, KANG & WAIMEY

(57) ABSTRACT

A display device is disclosed. The display device according to an embodiment of the present disclosure includes: a display panel; a frame disposed at a rear of the display panel and coupled to the display panel; at least one board on which electronic elements are mounted, and which is coupled to a rear of the frame; and a shield plate disposed at a rear of the at least one board and coupled to the frame, wherein the shield plate includes: a cover plate facing the at least one board; and a leg extending from one edge of the cover plate and coupled to the frame, wherein the leg includes: a first part extending from the cover plate; and a second part extending by being folded from the first part to face the first part, wherein the first part includes a conductive surface being in contact with the at least one board, and an insulation surface disposed opposite the conductive surface with respect to the first part; and the second part includes an insulation surface being in contact with the at least one board, and a conductive surface disposed opposite the insu- (Continued)

lation surface with respect to the second part and facing the first part.

10 Claims, 21 Drawing Sheets

(56) References Cited

FOREIGN PATENT DOCUMENTS

| | | |
|---|---|---|
| JP | 2007148275 | 6/2007 |
| JP | 2008177415 | 7/2008 |
| JP | 2008300550 | 12/2008 |
| JP | 2013092608 | 5/2013 |
| JP | 2018-156053 | 10/2018 |
| KR | 100625971 | 9/2006 |
| KR | 10-2008-0101598 | 11/2008 |
| KR | 10-2017-0068938 | 6/2017 |
| KR | 10-2020-0012639 | 2/2020 |

OTHER PUBLICATIONS

Korean Intellectual Property Office Application No. 10-2022-7038932, Office Action dated Jan. 30, 2024, 5 pages.
PCT International Application No. PCT/KR2020/004949, Search Report dated Jan. 11, 2021, 3 pages.

* cited by examiner

DISPLAY DEVICE

CROSS-REFERENCE TO RELATED APPLICATIONS

This application is the National Stage filing under 35 U.S.C. 371 of International Application No. PCT/KR2020/004949, filed on Apr. 13, 2020, the contents of which are all incorporated by reference herein in their entirety.

TECHNICAL FIELD

The following description relates to a display device.

BACKGROUND ART

With the development of the information society, there have been growing demands for various types of display devices, and in order to meet these demands, various display devices, such as a liquid crystal display (LCD), a Plasma Display Panel (PDP), an electroluminescent display (ELD), a vacuum fluorescent display (VFD), an organic light emitting diode (OLED) panel, etc., have been studied and used recently.

Among them, a display device using the organic light emitting diode (OLED) has excellent luminance and viewing angle characteristics compared to the LCD device, and does not need a backlight unit such that the OLED display device can be implemented as an ultrathin display device.

Recently, active research has been conducted on a structure of the display device.

DISCLOSURE OF INVENTION

Technical Problem

It is an objective of the present disclosure to solve the above and other problems.

It is another objective of the present disclosure to provide a ground structure of a display device.

It is yet another objective of the present disclosure to improve productivity of a display device.

Technical Solution

In accordance with an aspect of the present disclosure, the above and other objectives can be accomplished by providing a display device including: a display panel; a frame disposed at a rear of the display panel and coupled to the display panel; at least one board on which electronic elements are mounted, and which is coupled to a rear of the frame; and a shield plate disposed at a rear of the at least one board and coupled to the frame, wherein the shield plate includes: a cover plate facing the at least one board; and a leg extending from one edge of the cover plate and coupled to the frame, wherein the leg includes: a first part extending from the cover plate; and a second part extending by being folded from the first part to face the first part, wherein: the first part includes a conductive surface being in contact with the at least one board, and an insulation surface disposed opposite the conductive surface with respect to the first part; and the second part includes an insulation surface being in contact with the at least one board, and a conductive surface disposed opposite the insulation surface with respect to the second part and facing the first part.

Advantageous Effects of Invention

The display device according to the present disclosure has the following effects.

According to at least one of embodiments of the present disclosure, a ground structure of a display device may be provided.

According to at least one of embodiments of the present disclosure, productivity of a display device may be improved.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

MODE FOR THE INVENTION

Figure 1:
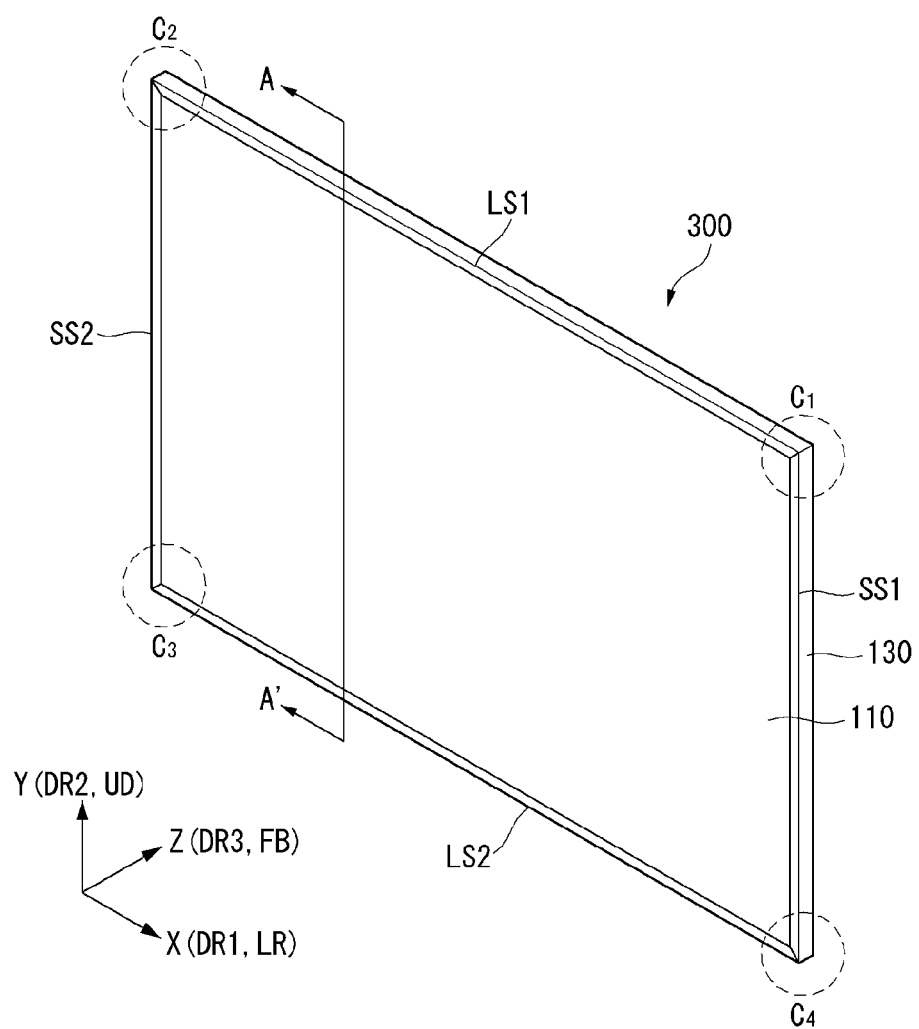
FIGS. 1 to 21 are diagrams illustrating examples of a display device according to embodiments of the present disclosure.

Hereinafter, embodiments of the present disclosure will be described in detail with reference to the accompanying drawings, in which the same or similar elements are designated by the same reference numerals, and a redundant description thereof will be omitted.

The terms "module" and "unit" for elements used in the following description are given simply in view of the ease of the description, and do not have a distinguishing meaning or role. It will be noted that a detailed description of known arts will be omitted if it is determined that the detailed description of the known arts can obscure the embodiments of the invention. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the singular forms are intended to include the plural forms as well, unless the context clearly indicates otherwise.

It should be understood that the terms "comprise", 'include", "have", etc. when used in this specification, specify the presence of stated features, integers, steps, operations, elements, components, or combinations of them but do not preclude the presence or addition of one or more other features, integers, steps, operations, elements, components, or combinations thereof.

Hereinafter, a display panel will be described using an Organic Light Emitting Diode (OLED) display panel as an example, but a display panel applicable to the present disclosure is not limited to the OLED display panel.

Referring to FIG. 1, a display device 300 may include a first long side LS1, a second long side LS2 opposite to the first long side LS1, a first short side SS1 adjacent to the first long side LS1 and the second long side LS2, and a second short side SS2 opposite to the first short side SS1.

In the display device 300, an area of the first short side SS1 may be referred to as a first side area, and an area of the second short side SS2 may be referred to as a second side area opposite to the first side area. In the display device 300, an area of the first long side LS1 may be referred to as a third side area adjacent to the first side area and the second side area and disposed between the first side area and the second side area, and an area of the second long side LS2 may be referred to as a fourth side area adjacent to the first side area and the second side area, disposed between the first side area and the second side area, and opposite to the third side area.

For convenience of explanation, it is illustrated and described that the first and second long sides LS1 and LS2 are longer than the first and second short sides SS1 and SS2, but it is also possible that the lengths of the first and second long sides LS1 and LS2 may be approximately equal to the lengths of the first and second short sides SS1 and SS2.

In the following description, a first direction DR1 may be a direction parallel to the long sides LS1 and LS2 of a display panel 110, and a second direction DR2 may be a direction parallel to the short sides SS1 and SS2 of the display panel 110. A third direction DR3 may be a direction perpendicular to the first direction DR1 and/or the second direction DR2.

A side or a surface, on which the display device 300 displays an image, may be referred to as a front side or a front surface. When the display device 300 displays an image, a side or a surface, at which the image cannot be observed, may be referred to as a rear side or a rear surface. When the display device 300 is viewed from the front side or the front surface, the first long side LS1 may be referred to as an upper side or an upper surface, and the second long side LS2 may be referred to as a lower side or a lower surface. When the display device 300 is viewed from the front side or the front surface, the first short side SS1 may be referred to as a right side or a right surface, and the second short side SS2 may be referred to as a left side or a left surface.

The first long side LS1, the second long side LS2, the first short side SS1, and the second short side SS2 may be referred to as edges of the display device 300. Further, positions where the first long side LS1, the second long side LS2, the first short side SS1, and the second short side SS2 meet each other may be referred to as corners. For example, a position where the first long side LS1 and the first short side SS1 meet each other may be referred to as a first corner C1, a position where the first long side LS1 and the second short side SS2 meet each other may be referred to as a second corner C2, a position where the second short side SS2 and the second long side LS2 meet each other may be referred to as a third corner C3, and a position where the second long side LS2 and the first short side SS1 meet each other may be referred to as a fourth corner C4.

A direction from the first short side SS1 to the second short side SS2 or a direction from the second short side SS2 to the first short side SS1 may be referred to as a left-right direction LR or a horizontal direction DR1. A direction from the first long side LS1 to the second long side LS2 or a direction from the second long side LS2 to the first long side LS1 may be referred to as an up-down direction UD or a vertical direction DR2.

Further, a direction from the front surface to the rear surface or a direction from the rear surface to the front surface may be referred to as a front-rear direction DR3 or a thickness direction FB. The front-rear direction DR3 may be a direction perpendicular to the left-right direction DR1 and/or the up-down direction DR2.

Figure 2:
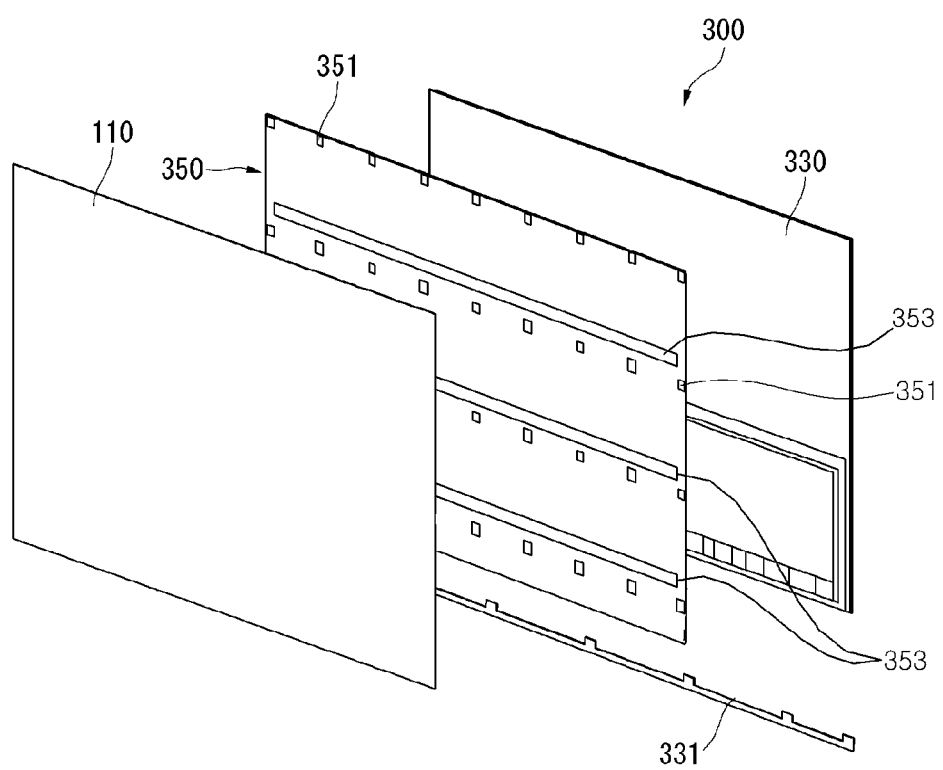
Figure 3:
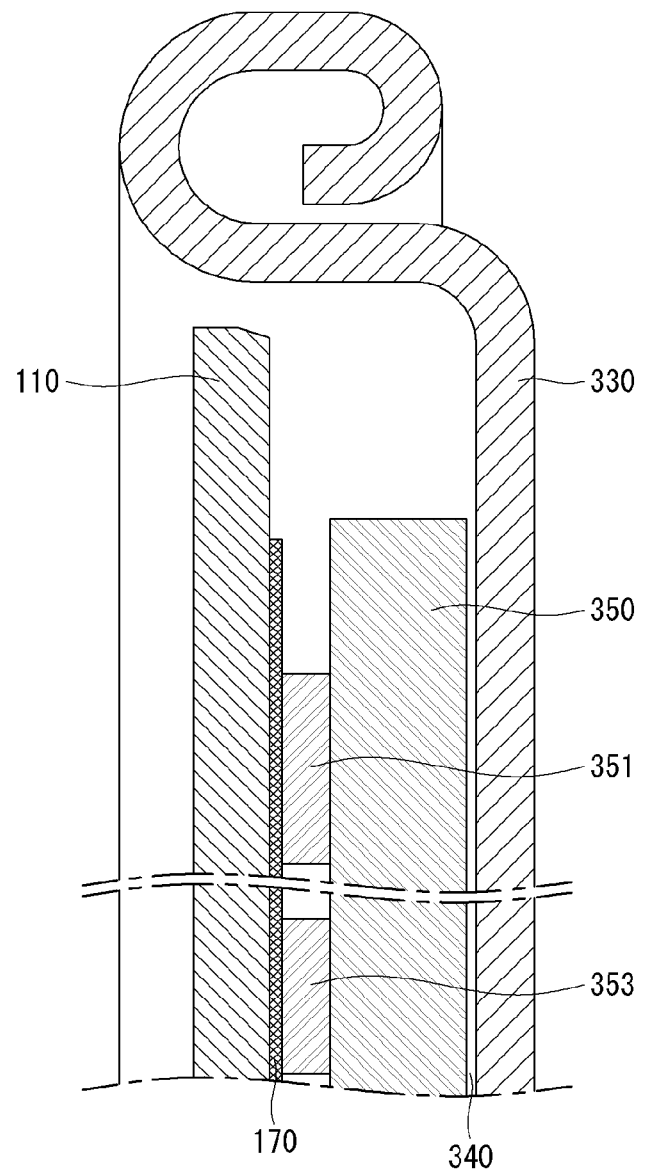

Referring to FIGS. 2 and 3, the display device 300 may include the display panel 110, a main frame 330, and an inner plate 350.

The display panel 110 may be provided on a front surface of the display device 300 and may display an image.

The main frame 330 may be disposed at the rear of the display panel 110. The main frame 330 may be coupled to the display panel 110. Edges of the main frame 330 may be bent at least once or more.

The main frame 330 may include a bottom frame 331. The bottom frame 331 may be disposed at a bottom end of the main frame 330. The bottom frame 331 may be separated from or coupled to the main frame 330. The main frame 330 and the bottom frame 331 may cover a lower surface of the display panel 110.

An inner plate 350 may be disposed at the rear of the display panel 110. The inner plate 350 may be disposed between the display panel 110 and the main frame 330. A front surface of the inner plate 350 may face the display panel 110. A rear surface of the inner plate 350 may be fixed or coupled to the main frame 330.

The inner plate 350 may face a support plate 170 mounted on a rear surface of the display panel 110. The inner plate 350 may be connected or coupled to the support plate 170 via coupling members 351 and 353.

Coupling portions 351 may be distributed over the inner plate 350. The coupling portions 351 may be distributed evenly over the entire area of the inner plate 350. The coupling portions 351 may be provided to allow the inner plate 350 and the main frame 330 to be coupled to each other.

Adhesive members 353 may be provided in a front side area of the inner plate 350. The adhesive members 353 may be disposed between the coupling portions 351. For example, the adhesive member 353 may be a double-sided tape. A plurality of adhesive members 353 may be elongated in a horizontal direction of the inner plate 350. The plurality of adhesive members 353 may be vertically spaced apart from each other.

Figure 4:
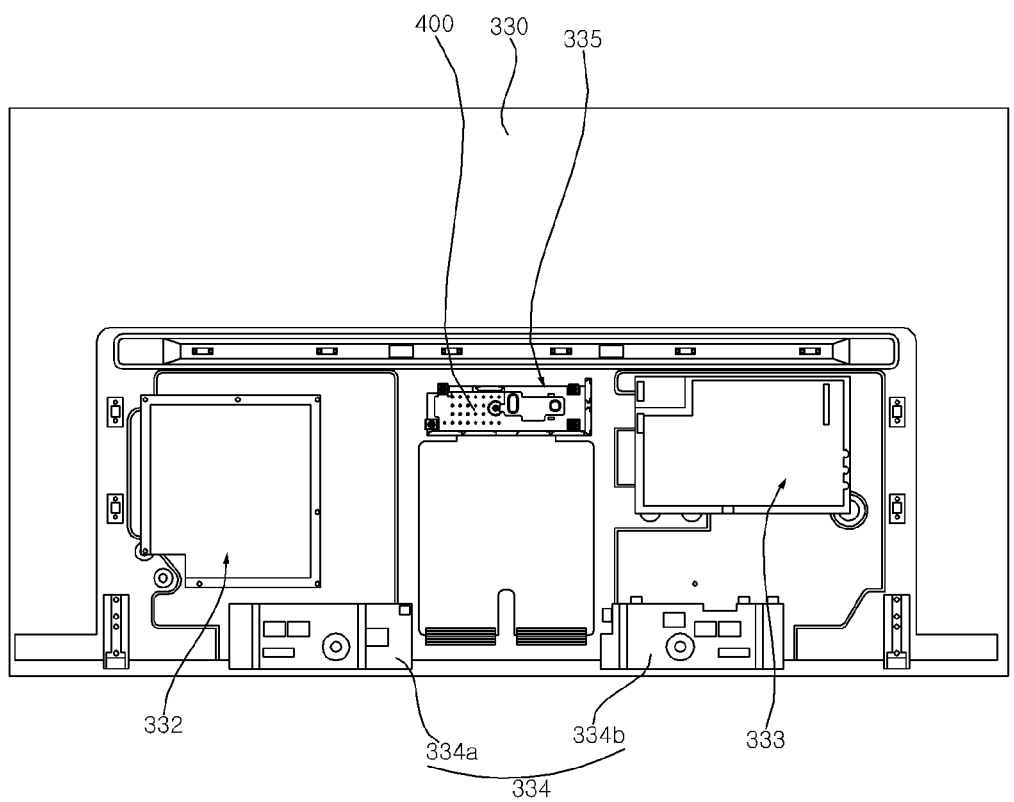
Figure 5:
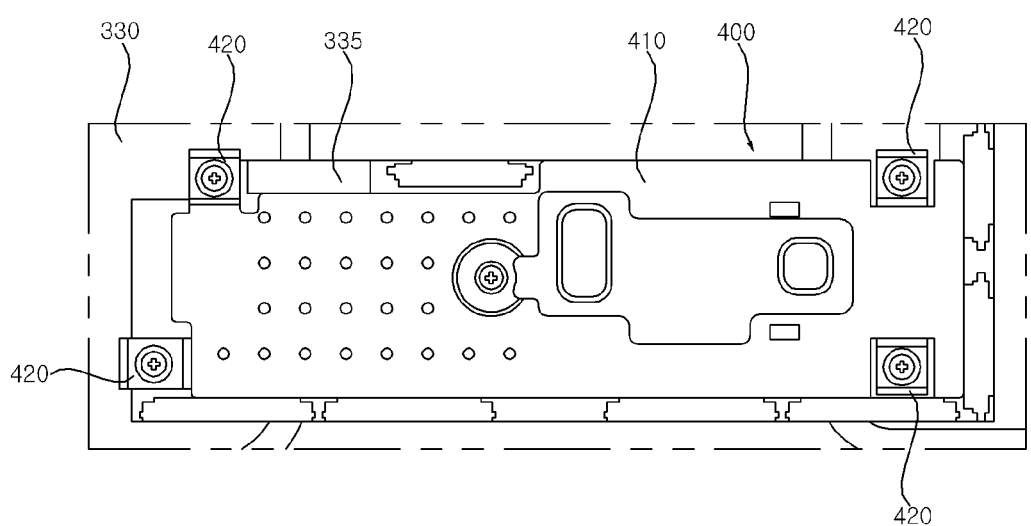

Referring to FIGS. 4 and 5, a power supply unit 332 may be mounted on the right side of a rear surface of the frame 330. A main board 333 may be mounted on the left side of the rear surface of the frame 330. A speaker unit 334 may include a pair of speaker units 334a and 334b which are disposed side by side at a lower side of the rear surface of the frame 330.

A T-CON board 335 may be disposed at the center of the rear surface of the frame 330. The T-CON board 335 may be disposed between the power supply unit 332 and the main board 333. A shield plate 400 may be mounted on the T-CON board 335. The shield plate 400 may be spaced apart from the T-CON board 335 and may be mounted on the frame 330 while covering an upper portion of the T-CON board 335. The shield plate 400 may be mounted on the main board 333, the power supply unit 332, and the like.

The shield plate 400 may include a cover plate 410 and legs 420. The cover plate 410 may have a shape corresponding to the T-CON board 335. The legs 420 may extend from the cover plate 410. The legs 420 may be fixed to the frame 330.

Figure 6:
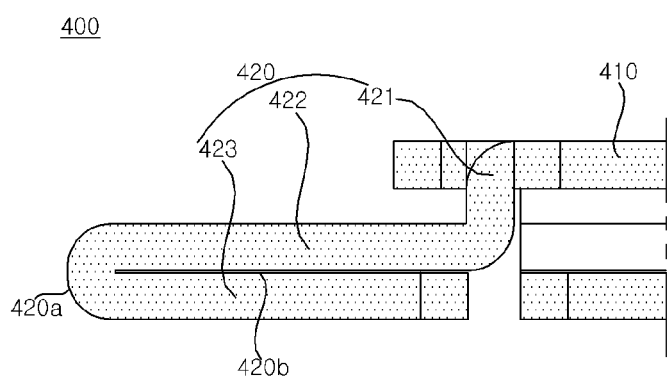

Referring to FIG. 6, the shield plate 400 may include an insulation surface 420a and a conductive surface 420b. A first surface 420a of the shield plate 400 may be coated with paint, and a second surface 420b may be a metal surface. For example, while the shield plate 400 may be made of a metal-containing material, only the first surface 420a may be painted.

The leg 420 may include a first part 421, a second part 422, and a third part 423. The first part 421 may be bent and extend from the cover plate 410. The first part 421 may extend in a direction intersecting a longitudinal direction of the cover plate 410. The second part 422 may be bent and extend from the first part 421. The second part 422 may cross an extending direction of the first part 421 and may be parallel to the longitudinal direction of the cover plate 410. The third part 423 may be bent and extend from the second part 422. The third part 423 may extend in a direction parallel to the second part 422. The third part 423 may face the second part 422. For example, the third part 423 may be bent 180 degrees from the second part 422.

The leg 420 may have the insulation surface 420a and the conductive surface 420b. The insulation surfaces 420a of the second part 422 and the third part 423 may face outward, and the conductive surfaces 420b of the second part 422 and the third part 423 may face inward. The conductive surface 420b of the second part 422 may face the conductive surface 420b of the third part 423.

Figure 7:
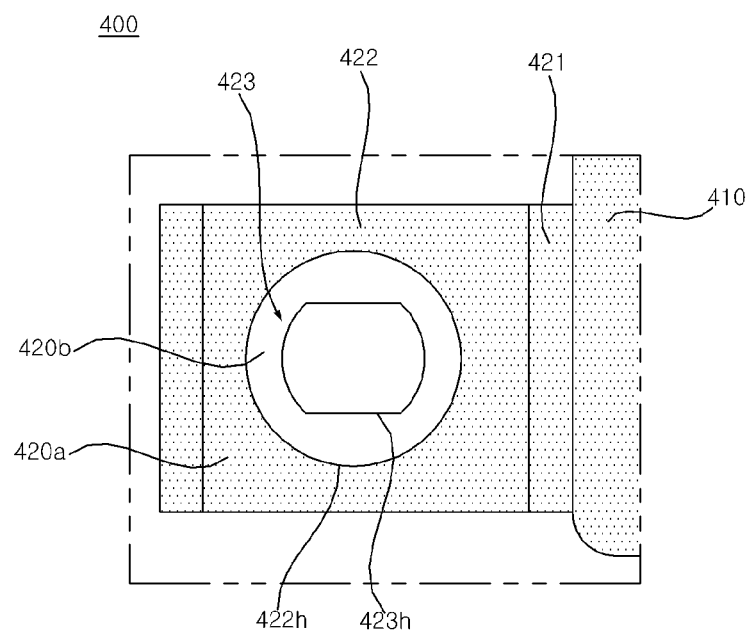
Figure 8:
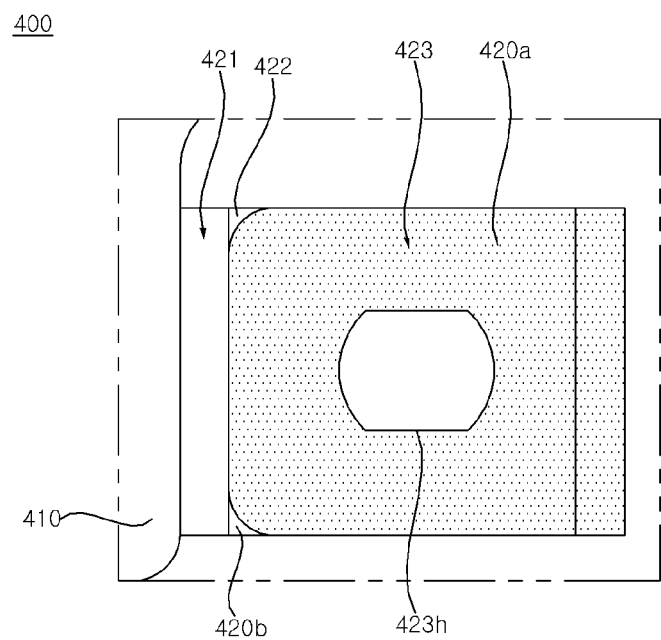

Referring to FIGS. 7 and 8, a first hole 422h may be formed in the second part 422. A second hole 423h may be formed in the third part 423. A diameter of the first hole 422h may be greater than a diameter of the second hole 423h. The first hole 422h may have the same center as the second hole 423h. The conductive surface 420b around the second hole 423h may be exposed to the outside through the first hole 422h. The insulation surface 420a of the second part 422 may be raised from the conductive surface 420b of the third part 423 to form a step.

Figure 9:
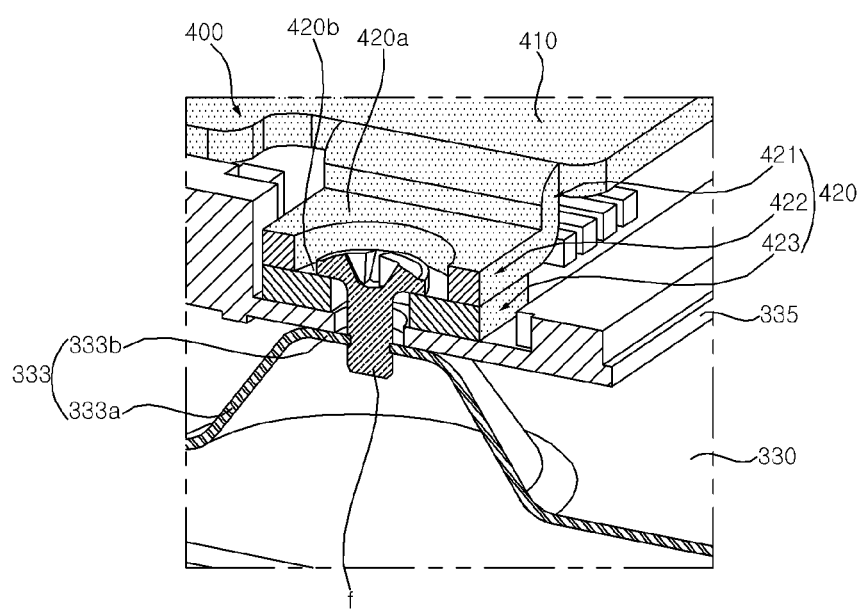

Referring to FIG. 9, the shield plate 400 may be coupled or fixed to the rear surface of the frame 330. A boss 333, which is formed by being pressed, may be disposed on the rear surface of the frame 330. The boss 333 may include an inclined portion 333a and a mounting portion 333b. Both front and rear surfaces of the frame 330 may be painted to ensure durability and reliability.

The T-CON board 335 may be mounted on the mounting portion 333b of the boss 333. The shield plate 400 may be disposed on the T-CON board 335. The leg 420 of the shield plate 400 may be disposed on the T-CON board 335 at a position corresponding to the boss 333. A fastening member f may pass through the first hole 422h (see FIG. 7) and the second hole 423h (see FIG. 7) of the leg 420. For example, the fastening member f may be a metal screw.

A head of the fastening member f may be in contact with the conductive surface 420b of the third part 423. A screw thread of the fastening member f may pass through the mounting portion 333b to be coupled to the boss 333.

The shield plate 400 may be electrically connected to the frame 330, such that a current generated in the shield plate 400 may be grounded through the frame 330. For example, a surge voltage applied to the shield plate 400 may be grounded through the frame 33.

Accordingly, the shield plate 400 may not only provide electrical stability but also effectively shield electromagnetic radiation.

Figure 10:
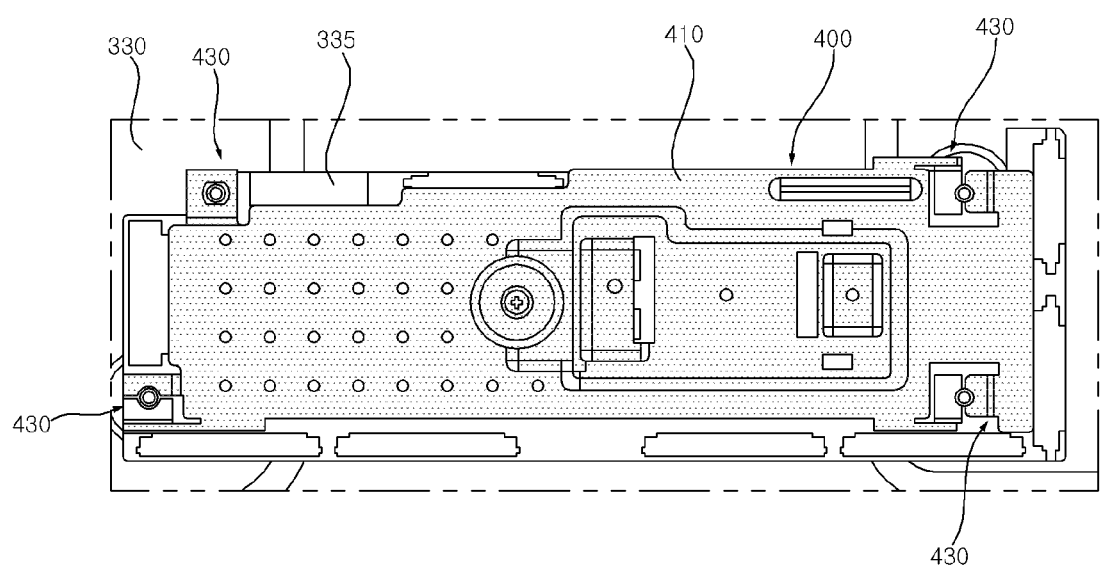

Referring to FIG. 10, the shield plate 400 may include the cover plate 410 and legs 430. The cover plate 410 may have a shape corresponding to the T-CON board 335. The legs 430 may extend from the cover plate 410. The legs 430 may extend from the cover plate 410, and the legs 430 may be fixed to the frame 330.

Figure 11:
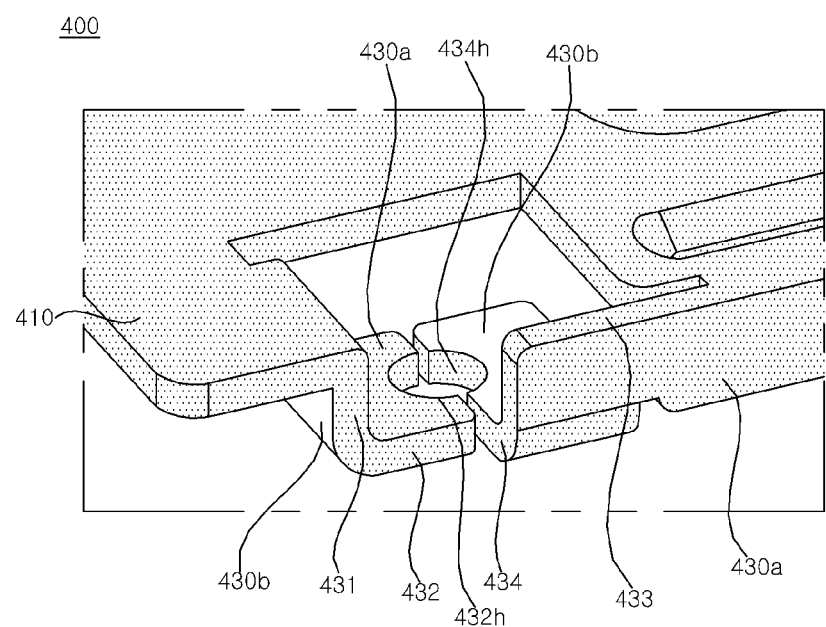
Figure 12:
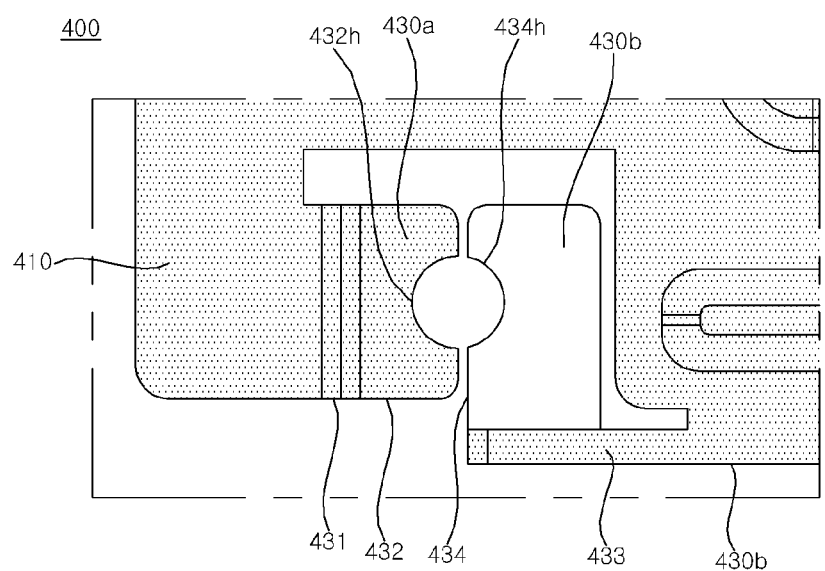
Figure 13:
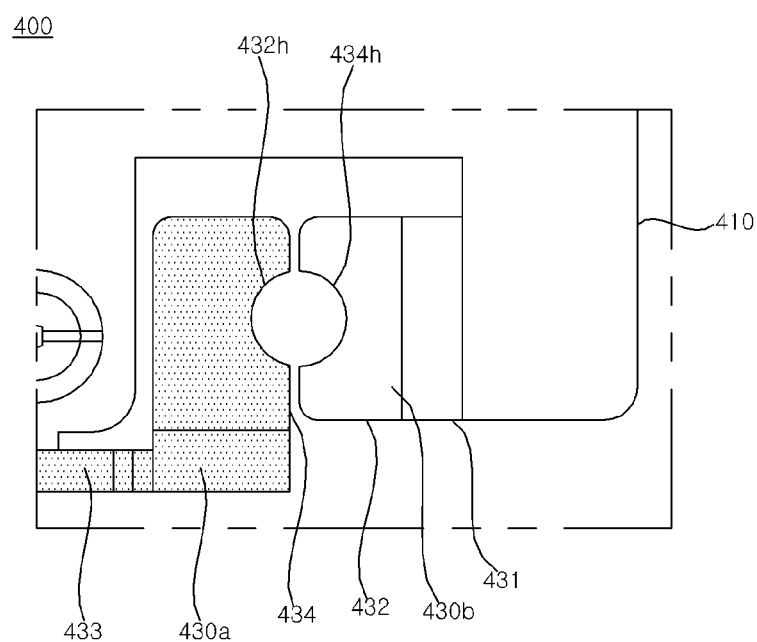

Referring to FIGS. 11 to 13, the shield plate 400 may include an insulation surface 430a and a conductive surface 430b. A first surface 430a of the shield plate 400 may be coated with paint, and a second surface 430b thereof may be a metal surface. For example, while the shield plate 400 is made of a metal-containing material, only the first surface 430a may be painted.

The legs 430 may include a pair of legs 430. The pair of legs 430 may include a first leg 431 and 432 and a second leg 433 and 434. The first leg 431 and 432 may be disposed adjacent to the second leg 433 and 434 and may be spaced apart from the second leg 433 and 434.

The first leg 431 and 432 may include a first part 431 and a second part 432. The first part 431 may be bent and extend from the cover plate 410 in a direction intersecting a plane of the cover plate 410. The second part 432 may be bent and extend from the first part 431. The second part 432 may be disposed parallel to the cover plate 410. The second part 432 may be stepped downward from the cover plate 410.

The second leg 433 and 434 may include a third part 433 and a fourth part 434. The third part 433 may be bent and extend from the cover plate 410 in a direction intersecting the plane of the cover plate 410. The fourth part 434 may be bent and extend from the third part 433. The fourth part 434 may be disposed parallel to the cover plate 410. The fourth part 434 plate 432 may be stepped downward from the cover plate 410.

A hole 432h and 434h may be formed across the second part 432 of the first leg 431 and 432 and the fourth part 434 of the second leg 433 and 434. For example, one half 432h of the hole 432h and 434h may be formed in the second part 432 of the first leg 431 and 432, and the other half 434h of the hole 432h and 434h may be formed in the fourth part 434 of the second leg 433 and 434.

The second part 432 may include the insulation surface 430a and the conductive surface 430b. The insulation surface 430a of the second part 432 may be disposed opposite the conductive surface 430b of the second part 432. The fourth part 434 may include the insulation surface 430a and the conductive surface 430b. The insulation surface 430a of the fourth part 434 may be disposed opposite the conductive surface 430b of the fourth part 434. The insulation surface 430a of the second part 432 and the conductive surface 430b of the fourth part 434 may be formed on the same plane, and the conductive surface 430b of the second part 432 and the insulation surface 430a of the fourth part 434 may be formed on the same plane.

Figure 14:
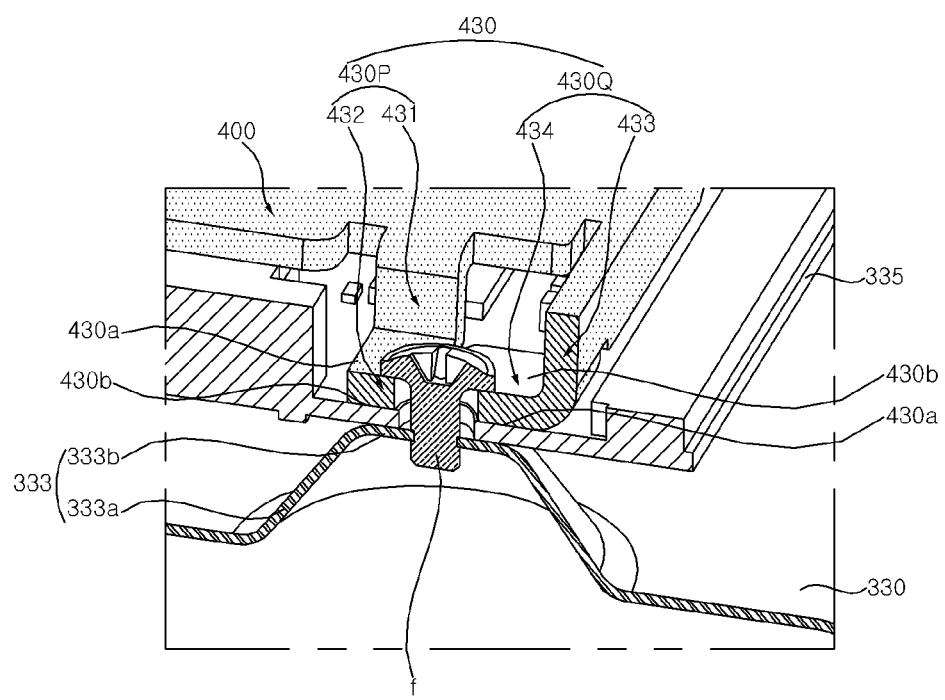

Referring to FIG. 14, the shield plate 400 may be coupled or fixed to the rear surface of the frame 330. The boss 333, which is formed by being pressed, may be disposed on the rear surface of the frame 330. The boss 333 may include the inclined portion 333a and the mounting portion 333b. Both front and rear surfaces of the frame 330 may be painted to ensure durability and reliability. The surfaces of the frame 330 may be insulation surfaces.

The T-CON board 335 may be mounted on the mounting portion 333b of the boss 333. The shield plate 400 may be disposed on the T-CON board 335. The leg 430 of the shield plate 400 may be disposed on the T-CON board 335 at a position corresponding to the boss 333. A fastening member f may pass through the hole 432h and 434h (see FIG. 12) of the leg 430. For example, the fastening member f may be a metal screw.

A head of the fastening member f may be in contact with the conductive surface 430b of the fourth part 424. A screw thread of the fastening member f may pass through the mounting portion 333b to be coupled to the boss 333.

The T-CON board 335 may be in contact with the conductive surface 430b of the second part 432. The T-CON board 335 may be in contact with the conductive surface 430b of a first leg 430P to be electrically connected to the shield plate 400, and the shield plate 400 may be electrically connected to the frame 330 by the screw f being in contact with the conductive surface 430b of a second leg 430Q.

Accordingly, the shield plate 400 may not only provide electrical stability but also effectively shield electromagnetic radiation.

Figure 15:
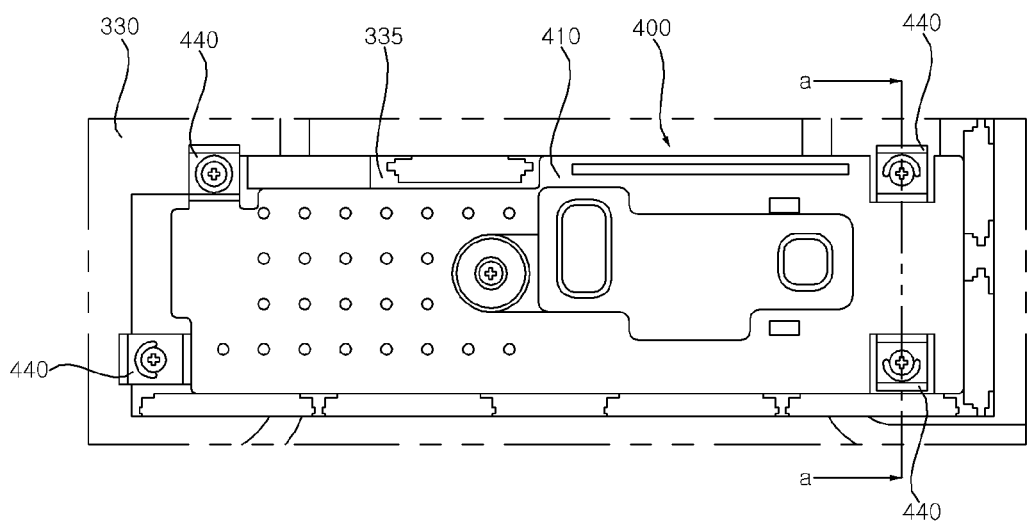

Referring to FIG. 15, the shield plate 400 may include the cover plate 410 and legs 440. The cover plate 41 may have a shape corresponding to the T-CON board 335. The legs 440 may extend from the cover plate 410. The legs 440 may extend from the cover plate 410, and the legs 440 may be fixed to the frame 330.

An outer surface of the shield plate 400 may be insulated. The outer surface of the shield plate 400 may be a surface opposite the T-CON board 335 with respect to the shield plate 400. For example, the outer surface of the shield plate 400 may be coated with paint or insulation paint.

Figure 16:
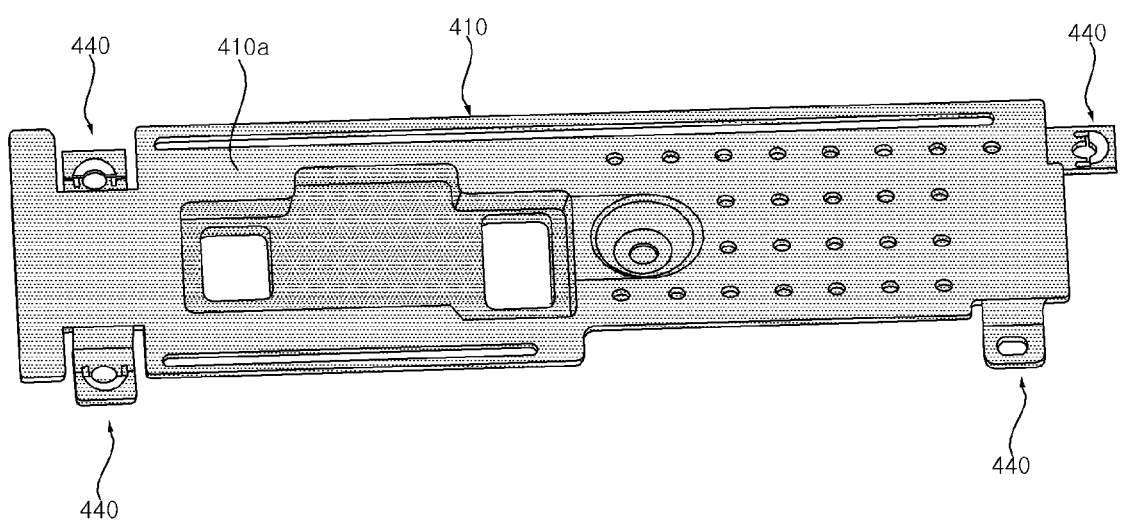

Referring to FIG. 16, the shield plate 400 may include an insulation surface 410a. The insulation surface 410a of the shield plate 400 may be a surface coated with paint. The insulation surface 410a may be the outer surface of the shield plate 400. The shield plate 400 may include the cover plate 410 and the legs 440. The cover plate 410 and the legs 440 may be formed by pressing the shield plate 400 which is a flat plate. The legs 440 may be stepped downward from the insulation surface 410a.

Figure 17:
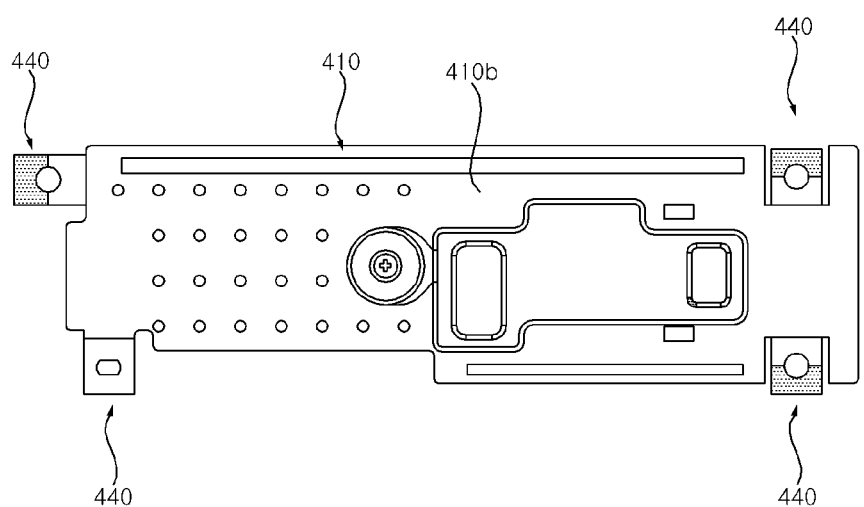

Referring to FIG. 17, the shield plate 400 may include the conductive surface 410b. The conductive surface 410b of the shield plate 400 may be made of the same material as the shield plate 400. For example, the shield plate 400 may include a metal material. In another example, the shield plate 400 may be stainless or aluminum.

The conductive surface 410b may be an inner surface of the shield plate 400. The shield plate 400 may include the cover plate 410 and the legs 440. The cover plate 410 and the legs 440 may be formed by pressing the shield plate 400 which is a flat plate. The legs 440 may be stepped upward from the conductive surface 410b.

Figure 18:
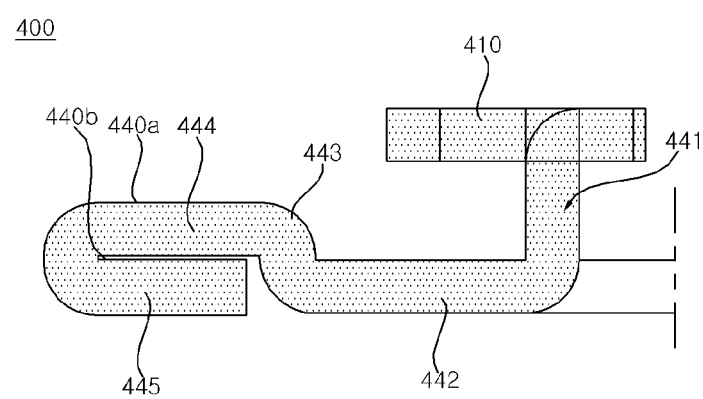

Referring to FIG. 18, the shield plate 400 may include an insulation surface 440a and a conductive surface 440b. A first surface 440a of the shield plate 400 may be coated with paint, and a second surface 440b thereof may be a metal surface. For example, while the shield plate 400 may be made of a metal-containing material, only the first surface 440a may be painted.

The leg 440 may include a first part 441, a second part 442, a third part 443, a fourth part 444, and a fifth part 445. The first part 441 may be bent and extend from the cover plate 410. The first part 441 may extend in a direction intersecting a longitudinal direction of the cover plate 410.

The second part 442 may be bent and extend from the first part 441. The second part 442 may cross an extending direction of the first part 441 and may be parallel to the longitudinal direction of the cover plate 410.

The third part 443 may be bent and extend from the second part 442. The third part 443 may extend in a direction parallel to the first part 441. The third part 443 may face the first part 441.

The fourth part 444 may be bent and extend from the third part 443. The fourth part 444 may extend in a direction parallel to the cover plate 410 or the second part 442. The fourth part 444 may be stepped upward from the second part 442.

The fifth part 445 may be bent and extend from the fourth part 444. The fifth part 445 may be folded from the fourth part 444 to face the fourth part 444. For example, the fifth part 445 may be bent 180 degrees from the fourth part 444.

Figure 19:
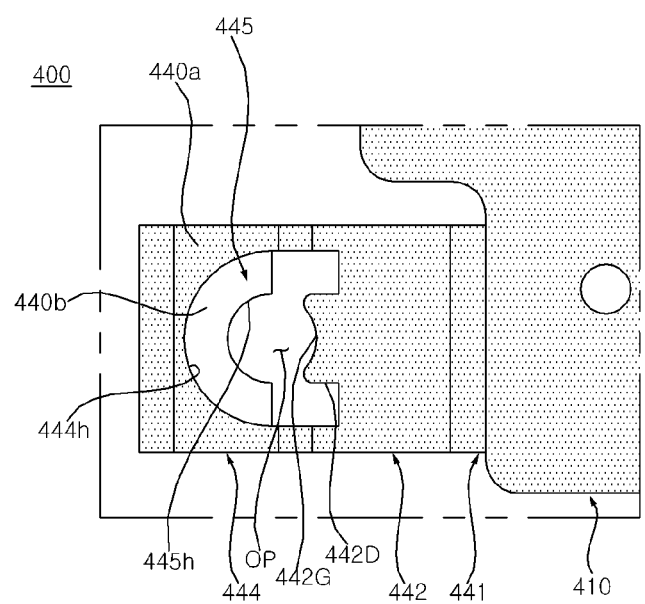
Figure 20:
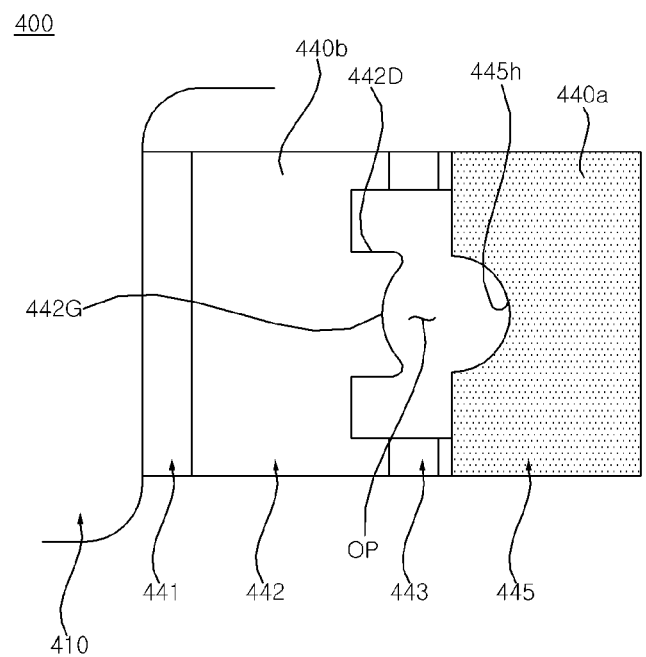

Referring to FIGS. 19 and 20, an opening OP may be formed across the second part 442, the third part 443, and the fourth part 444. The opening OP may be formed by passing through the second part 442, the third part 443, and the fourth part 444, and may have a generally rectangular shape. The opening OP may have a long side in a longitudinal direction along a boundary between the second part 442 and the third part 443. A first semicircular portion 444h may be formed by passing through the fourth part 444. A diameter of the first semicircular portion 444h may be one long side of the opening OP.

A second semicircular portion 445h may be formed in the fifth part 445. The second semicircular portion 445h may be formed by cutting out a distal end of the fifth part 445. A diameter of the second semicircular portion 445h may be greater than the diameter of the first semicircular portion 444h. The conductive surface 440b of the fifth part 445 may be exposed through the first semicircular portion 444h.

A dock 442D may extend from the second part 442. The dock 442D may be formed on another long side of the opening OP. The dock 442D may include a gulf part 442G. The gulf part 442G may be formed by being recessed inwardly from the dock 442D. The gulf part 442G may generally form a circle with the second semicircular portion 445h.

Figure 21:
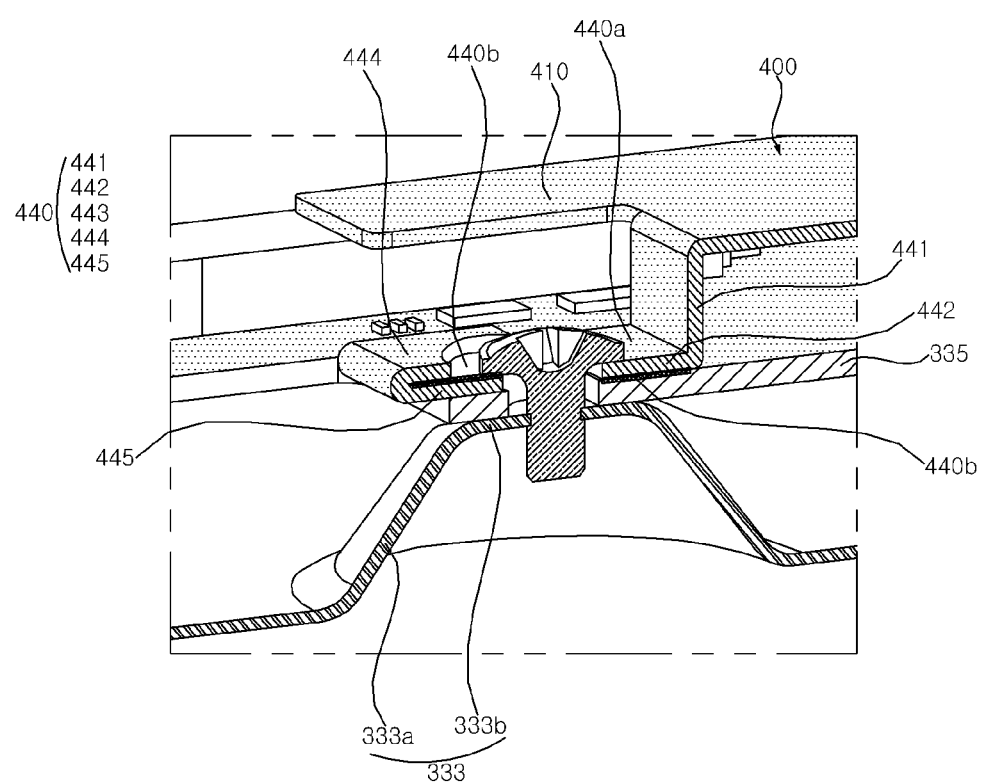

Referring to FIG. 21, the shield plate 400 may be coupled or fixed to the rear surface of the frame 330. The boss 333, which is formed by being pressed, may be disposed on the rear surface of the frame 330. The boss 333 may include the inclined portion 333a and the mounting portion 333b. Both front and rear surfaces of the frame 330 may be painted to ensure durability and reliability. The surfaces of the frame 330 may be insulation surfaces.

The T-CON board 335 may be mounted on the mounting portion 33b of the boss 333. The shield plate 400 may be mounted on the T-CON board 335. The leg 440 of the shield plate 400 may be disposed on the T-CON board 335 at a position corresponding to the boss 333. The fastening member f may pass through the opening OP (see FIG. 19) of the leg 440. For example, the fastening member f may be a metal screw.

Referring to the figure along with FIG. 19, a head of the fastening member f may be in contact with the conductive surface 440b of the fifth part 445. The head of the fastening member f may be in contact with the dock 442D and the gulf part 442G of the second part 442.

A screw thread of the fastening member f may pass through the mounting portion 333b of the boss 333 to be coupled to the boss 333.

The T-CON board 335 may be in contact with the conductive surface 400b of the second part 442. The T-CON board 335 may be in contact with the conductive surface 440b of the second part 442 to be electrically connected to the shield plate 400, and the shield plate 400 may be electrically connected to the frame 330 by the screw f being in contact with the conductive surface 440*b* of the fifth part 445.

Accordingly, the shield plate 400 may not only provide electrical stability but also effectively shield electromagnetic radiation.

According to an embodiment of the present disclosure, there is provided a display device including: a display panel; a frame disposed at a rear of the display panel and coupled to the display panel; at least one board on which electronic elements are mounted, and which is coupled to a rear of the frame; and a shield plate disposed at a rear of the at least one board and coupled to the frame, wherein the shield plate may include: a cover plate facing the at least one board; and a leg extending from one edge of the cover plate and coupled to the frame, wherein the leg may include: a first part extending from the cover plate; and a second part extending by being folded from the first part to face the first part, wherein the first part may include a conductive surface being in contact with the at least one board, and an insulation surface disposed opposite the conductive surface with respect to the first part; and the second part may include an insulation surface being in contact with the at least one board, and a conductive surface disposed opposite the insulation surface with respect to the second part and facing the first part.

According to another embodiment of the present disclosure, the display device may further include a fastening member coupled to the frame by passing through the first part and the second part of the leg, wherein the fastening member may include: a head being in contact with the conductive surface of the second part; and a screw thread extending from the head and inserted into the frame.

According to another embodiment of the present disclosure, the first part of the leg may include an opening formed by passing through the first part; and the second part of the leg may include a semicircular portion formed by cutting out at least a portion of the second part, wherein a size of the cut-out semicircular portion may be smaller than a size of the opening.

According to another embodiment of the present disclosure, the leg may further include a dock disposed at the opening and protruding into the opening from the first part, wherein the head of the fastening member may be simultaneously in contact with the dock and the second part.

According to another embodiment of the present disclosure, the leg may further include a gulf part formed at a distal end of the dock and forming a circle with the semicircular portion.

According to another embodiment of the present disclosure, the gulf part may be spaced apart from the semicircular portion.

According to another embodiment of the present disclosure, both of front and rear surfaces of the frame may be coated with an insulation material.

According to another embodiment of the present disclosure, a distal end of the second part may be spaced apart from a distal end of the dock.

According to another embodiment of the present disclosure, the cover plate may include an insulation surface coated with an insulation material and forming an outer surface of the shield plate; and a conductive surface facing the at least one board and disposed opposite the insulation surface, wherein the insulation surface of the first part of the leg may be a surface extending from the insulation surface of the cover plate, and the conductive surface of the first part of the leg may be a surface extending from the conductive surface of the cover plate.

According to another embodiment of the present disclosure, the insulation surface of the second part of the leg may be a surface extending from the insulation surface of the first part, and the conductive surface of the second part of the leg may be a surface extending from the conductive surface of the first part.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
   a display panel;
   a frame disposed at a rear of the display panel and coupled to the display panel;
   at least one board on which electronic elements are mounted, and the at least one board is coupled to a rear of the frame; and
   a shield plate disposed at a rear of the at least one board and coupled to the frame,
   wherein the shield plate comprises:
   a cover plate facing the at least one board; and
   a leg extending from one edge of the cover plate and coupled to the frame,
   wherein the leg comprises:
   a first part extending from the cover plate; and
   a second part extending by being folded from the first part to face the first part,
   wherein:
   the first part comprises a conductive surface being in contact with the at least one board, and an insulation surface disposed opposite the conductive surface with respect to the first part; and
   the second part comprises an insulation surface being in contact with the at least one board, and a conductive surface disposed opposite the insulation surface with respect to the second part and facing the first part.

2. The display device of claim 1, further comprising a fastening member coupled to the frame by passing through the first part and the second part of the leg,
   wherein the fastening member comprises:
   a head being in contact with the conductive surface of the second part; and
   a screw thread extending from the head and inserted into the frame.

3. The display device of claim 2, wherein:
the first part of the leg has an opening formed by passing through the first part; and
the second part of the leg has a semicircular portion formed by cutting out at least a portion of the second part,
wherein a size of the cut-out semicircular portion is smaller than a size of the opening.

4. The display device of claim 3, wherein the leg further comprises a dock disposed at the opening and protruding into the opening from the first part,
wherein the head of the fastening member is simultaneously in contact with the dock and the second part.

5. The display device of claim 4, wherein the leg further comprises a gulf part formed at a distal end of the dock and forming a circle with the semicircular portion.

6. The display device of claim 5, wherein the gulf part is spaced apart from the semicircular portion.

7. The display device of claim 6, wherein both of front and rear surfaces of the frame are coated with an insulation material.

8. The display device of claim 7, wherein a distal end of the second part is spaced apart from a distal end of the dock.

9. The display device of claim 8, wherein the cover plate comprises:
an insulation surface coated with an insulation material and forming an outer surface of the shield plate; and
a conductive surface facing the at least one board and disposed opposite the insulation surface,
wherein the insulation surface of the first part of the leg is a surface extending from the insulation surface of the cover plate, and the conductive surface of the first part of the leg is a surface extending from the conductive surface of the cover plate.

10. The display device of claim 9, wherein the insulation surface of the second part of the leg is a surface extending from the insulation surface of the first part, and the conductive surface of the second part of the leg is a surface extending from the conductive surface of the first part.

* * * * *